(12) United States Patent
Sahl

(10) Patent No.: US 8,768,280 B2
(45) Date of Patent: Jul. 1, 2014

(54) METHOD AND APPARATUS RELATING TO SIGNAL CONTROL

(75) Inventor: Stefan Sahl, Solna (SE)

(73) Assignee: Optis Cellular Technology, LLC, Plano, TX (US)

( * ) Notice: Subject to any disclaimer, the term of this patent is extended or adjusted under 35 U.S.C. 154(b) by 0 days.

(21) Appl. No.: 13/509,826

(22) PCT Filed: Dec. 30, 2009

(86) PCT No.: PCT/SE2009/051513
§ 371 (c)(1),
(2), (4) Date: May 15, 2012

(87) PCT Pub. No.: WO2011/081582
PCT Pub. Date: Jul. 7, 2011

(65) Prior Publication Data
US 2012/0264386 A1 Oct. 18, 2012

(51) Int. Cl.
H04B 1/26 (2006.01)
H04B 15/00 (2006.01)
H04B 1/18 (2006.01)
H03J 7/04 (2006.01)
H03G 3/30 (2006.01)

(52) U.S. Cl.
CPC ............... H03G 3/3052 (2013.01); H03J 7/04 (2013.01)
USPC ...................... 455/315; 455/192.2; 455/196.1; 455/257

(58) Field of Classification Search
USPC .......... 455/192.1, 192.2, 196.1, 232.1, 234.1, 455/234.2, 255, 257, 258, 259, 315, 318; 375/344, 345
See application file for complete search history.

(56) References Cited

U.S. PATENT DOCUMENTS

| 5,574,997 A * | 11/1996 | Hong ...................... 455/180.1 |
| 6,072,998 A | 6/2000 | Kaku |
| 2008/0287067 A1* | 11/2008 | Kawamura et al. .......... 455/63.1 |
| 2009/0079501 A1 | 3/2009 | Watai |
| 2009/0108931 A1 | 4/2009 | Wagt |
| 2009/0323873 A1* | 12/2009 | Hunter et al. ................ 375/350 |
| 2011/0053537 A1* | 3/2011 | Nagaraj et al. ............... 455/208 |

FOREIGN PATENT DOCUMENTS

| GB | 2116794 A | 9/1983 |
| WO | WO 2007/115014 A1 | 10/2007 |
| WO | WO 2007/148261 A2 | 12/2007 |

OTHER PUBLICATIONS

International Search Report, PCT Application No. PCT/SE2009/051513, Sep. 1, 2010 (5 pages).
Written Opinion of the International Searching Authority, PCT Application No. PCT/SE2009/051513, Sep. 1, 2010 (4 pages).
Supplementary European Search Report corresponding to European Patent Application No. 09852857.3-1810 dated Jan. 24, 2014.

* cited by examiner

*Primary Examiner* — Nguyen Vo
(74) *Attorney, Agent, or Firm* — Vincent J. Allen; Carstens & Cahoon, LLP

(57) ABSTRACT

The present invention relates to automatic gain control methods and apparatus for controlling a signal level of a signal at a predetermined location in a signal path of a receiver chain. An automatic gain controller comprises a local signal modifier device for selecting based on an error signal and an oscillator signal from a plurality of alternative oscillator signals, and for providing the selected oscillator signal to a signal mixer located in the receiver chain upstream of said predetermined location for frequency translation of an input signal to said signal mixer.

10 Claims, 6 Drawing Sheets

METHOD AND APPARATUS RELATING TO SIGNAL CONTROL

CROSS REFERENCE TO RELATED APPLICATIONS

This application is a 35 U.S.C. §371 national stage application of PCT International Application No. PCT/SE2009/051513, filed on 30 Dec. 2009, the disclosure and content of which is incorporated by reference herein in its entirety. The above-referenced PCT International Application was published in the English language as International Publication No. WO 2011/081582 A1 on 7 Jul. 2011.

TECHNICAL FIELD

The present invention relates to automatic gain control of electrical signals in a signal path. More specific, the present invention provides an Automatic Gain Control block and a method for controlling the signal level in the signal path of a receiver chain.

BACKGROUND

A radio receiver must be able to handle both weak and strong signals. Most often the amplitude detector in the final stage in the receiver must have its input signal at a specific amplitude for optimal performance. This problem is often solved according to prior art by inserting amplifiers having Automatic Gain Control, AGC, functionality into the signal path through the radio receiver. The AGC will change the gain of the amplifier when the strength, i.e. the level, of the input signal changes to keep the detector signal at a predetermined level. The gain change can be achieved in a continuous manner or in discrete steps.

Existing technologies for implementing AGC functions with discrete steps uses switches in some form to realize programmable gain amplifiers, PGA, or programmable attenuators. The switches are usually implemented in FET or MOS technologies or with PIN diodes. The switches can be used to switch in attenuator steps in the signal path, switch in more or less feedback in an amplifier or switching on and off whole amplifier stages. All those methods change the total gain in the receiver.

US patent publications U.S. No. 2009/0079501, denoted ref [1], and U.S. No. 2009/0108931, denoted ref [2], describe circuits with programmable gain implemented with switches.

Ref [1] teaches different automatic gain control designs. Further, a method to compensate the on resistance problem by having "dummy" switches that should track the ones in the feedback. This shows that on resistance is a problem when using switches.

Also Ref [2] teaches automatic gain control comprising switches for setting the attenuation level.

The use of switches for implementing AGC functions has several disadvantages, especially if the radio receiver is implemented at an integrated circuit, e.g. an ASIC, Application Specific Integrated Circuit.

Switches may be implemented in an ASIC by means of Positive Intrinsic Negative, PIN, diode technology, but said diodes are known for consuming a lot of current in some design conditions, and they are therefore not power efficient. When using PIN diodes as switching elements means they are either reversed biased, which will not consume any current, or forward biased, which will consume current. The current is usually large since the trans-conductance, $g_m$, of the diode must be large, which is defined by the diode equation. The trans-conductance must be large to make the PIN-switch having a low on resistance. The following equations shows the relationship between trans-conductance and bias current $I_D$.

$$I_D = I_S \cdot (e^{qV_D/(kT)} - 1) \approx I_S \cdot e^{qV_D/(kT)}$$

$$g_m = \frac{dI_D}{dV_D} \approx \frac{I_D}{kT/q}$$

The use of Field Effect Transistor, FET, or Metal Oxide Semiconductor, MOS, technology for implementing the switches in the signal path of a receiver chain involves a trade-off between low resistance in on state and low capacitance in off state. Both FET and MOS transistors works with a channel. When they are used as switches the channel is completely open or closed.

To minimize the on resistance and parasitic capacitance the length of the transistor is made as small as the technology allows. Making the switch wide will lower the on resistance but will also increase the parasitic capacitance that will limit the high frequency performance.

FET and MOS switches have a maximum voltage they can handle. Often large signal amplitudes need to be handled. This can limit the usage of a FET or MOS switches.

As described, the use of amplifier circuits having automatic gain control functionality in the signal path of a receiver chain may introduce a number of problems to be solved or avoided.

SUMMARY

One object of the present invention is to provide a solution to the above problems.

The present invention therefore provides an Automatic Gain Control and a method for controlling the signal level in the signal path of a receiver chain.

According to one embodiment of the present invention an automatic gain control block is provided for controlling a signal level of a signal at a predetermined location in a signal path of a receiver chain. The automatic gain controller is comprising detection and error generating units, which are configured to measure the signal level of the signal and to generate an error signal as the difference between the measured signal level and a target signal level, and a local signal modifier device for selecting based on an error signal an oscillator signal from a plurality of alternative oscillator signals and providing the selected oscillator signal to a signal mixer located in the receiver chain upstream of said predetermined location for frequency translation of an input signal to said signal mixer.

Further, the present invention is also providing a method for controlling the signal level of a signal at a predetermined location in a signal path of a receiver chain. The signal level of the signal is measured and an error signal is generated as the difference between the measured signal level and a target signal level. The signal level is controlled by means of an automatic gain controller of said receiver chain by selecting based on said error signal an oscillator signal from a set of plurality of alternative oscillator signals. The selected oscillator signal is provided to a signal mixer located in the receiver chain upstream of said predetermined location for frequency translation of an input signal to said signal mixer.

Further embodiments of the present invention is presented in the dependent claims.

One advantage with the present invention is that switching elements in the signal paths will be avoided.

Further one advantage is that the Automatic Gain Control block circuit according to the invention may be implemented as an ASIC (Application Specific Integrated Circuit) comprising electronic components that are power effective, i.e. not consuming a lot of current as e.g. PIN diodes.

An additional advantage is that the present invention is capable of handling large signal amplitudes, which have to be handled in some receiver applications. The maximum signal amplitude is increased and becomes a non-critical feature by using an AGC according to the invention instead of a conventional AGC.

Further, the present invention provides a solution to the parasitic capacitance problem, which limits the high frequency performance as discussed in the background section above. The present invention offers increased high frequency performance by avoiding FET and MOS transistors and switches.

BRIEF DESCRIPTION OF THE DRAWINGS

The foregoing, and other, objects, features and advantages of the present invention will be more readily understood upon reading the following detailed description in conjunction with the drawings in which.

DETAILED DESCRIPTION

In the following description, for purposes of explanation and not limitation, specific details are set forth, such as particular circuits, circuit components, techniques, etc. in order to provide a thorough understanding of the present invention. However, it will be apparent to one skilled in the art that the present invention may be practiced and other embodiments that depart from these specific details. In other instances, detailed descriptions of well known methods, devices, and circuits are omitted so as not to obscure the description of the present invention with unnecessary detail.

Figure 1:
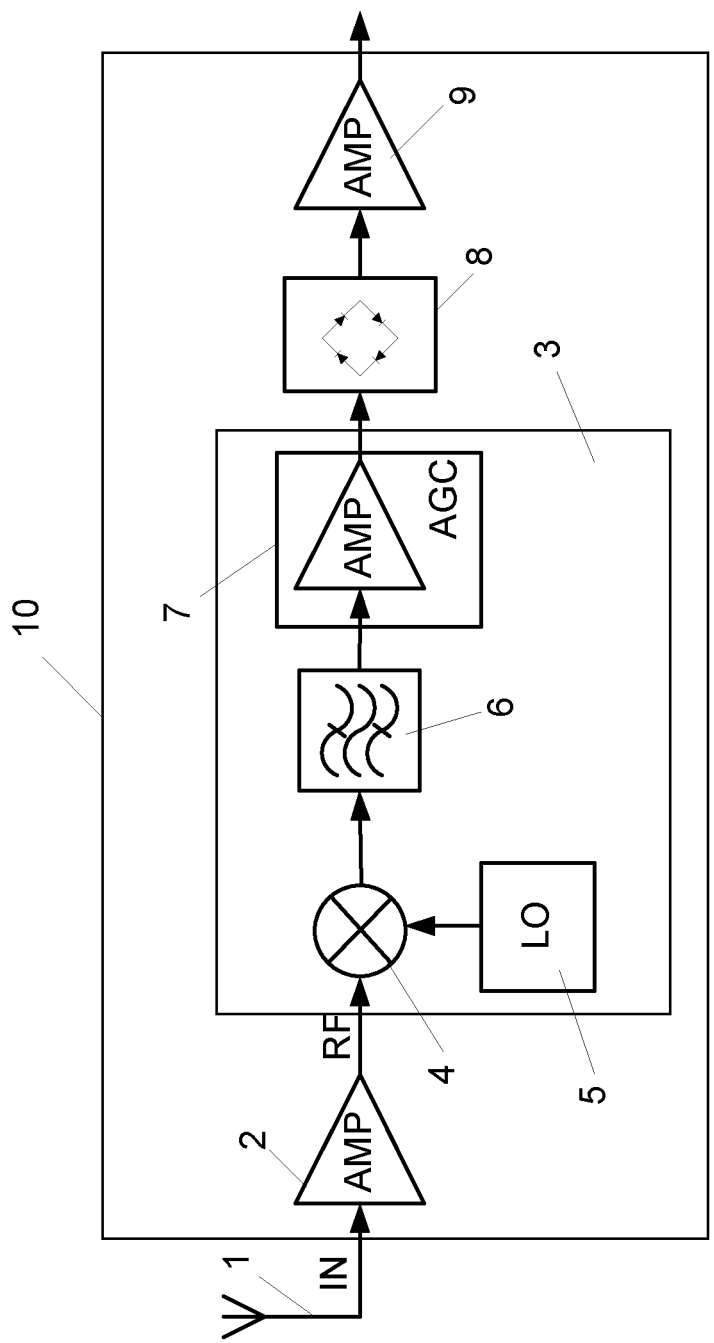
FIG. 1 is a block diagram illustrating a super heterodyne receiver according to prior art.

FIG. 1 is a block diagram illustrating a super heterodyne receiver 10 according to prior art.

Said known receiver will now be briefly discussed. A signal is received by the antenna 1 which is connected to the input of the super heterodyne receiver 10. The information carried by the signal is modulated on a carrier radio wave in the radio frequency RF band and is therefore denoted RF signal. The received signal is amplified or attenuated by a RF amplifier block 2 such that the amplitude level of the received RF signal is adjusted to the operating level of the receiver. The amplifier block 2 is preferably equipped with an Automatic Gain Control, AGC, for said purpose. In the next step, the RF signal frequency is adjusted to a lower operating frequency, i.e. a down conversion or frequency shifting/translation is performed. The down conversion may also be performed in several steps, or stages, instead of one frequency step. In the figure, only one down conversion stage 3 is illustrated. Said stage 3 is comprising a signal mixer 4, a filter 6, preferably a band-pass filter, and an Intermediate Frequency, IF, amplifier block 7, which preferably is equipped with an AGC. The signal mixer 4 has two inputs, one for the RF signal and one for receiving the oscillator signal from the Local Oscillator, LO, 5. The oscillator signal has a fixed operating frequency, amplitude and shape. Said operating frequency has been set to a frequency that in combination with the RF signal frequency will produce an IF signal being lower than the RF signal. A lot of sideband harmonic signals is also generated in the mixing process. Said side band harmonic signals are cancelled by means of the filter 6. Said IF signal is then adjusted to the correct signal level for the next blocks in the receiver chain by the IF amplifier block 7 comprising an AGC. The next step may be a new down conversion stage for further frequency shifting to a new frequency band below the IF band, or a demodulator block 8 for separating the modulated signal from its carrier wave. If the signal content is in the audio/voice frequency band, said audio/voice content is amplified by an audio amplifier 9 before being presented by a loud speaker (not shown). The AGC functionality in a receiver chain may be implemented in different known ways, e.g. by using AGC designs with switches as known from Ref. [1] and Ref. [2].

In FIG. 1, the design of the receiver chain of functional blocks in a super heterodyne receiver and the signal path through said receiver has been briefly described. By the following description, it will be appreciated by a person skilled in the art that the present invention, which relates to Automatic Gain Control methods and devices, will be applicable in any receiver design and receiver chain technology using down-conversion via a mixer.

The present invention relates to Automatic Gain Control of a signal level of a signal at a predetermined location in a signal path of a receiver chain. In the following different embodiments of an Automatic Gain Control, AGC, block according to the invention are described.

Figure 2:
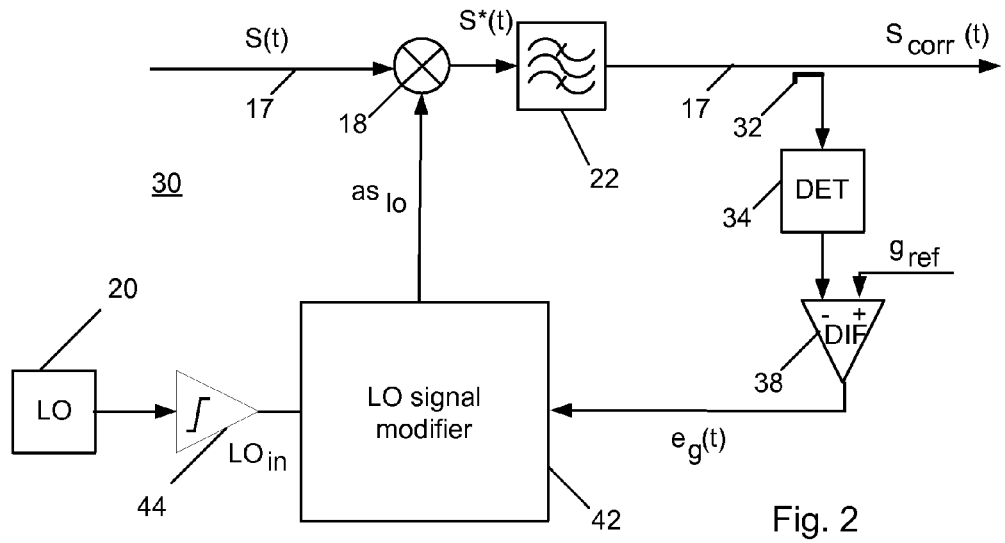
FIG. 2 is a block diagram illustrating an embodiment of an Automatic Gain Control, AGC, block according to the invention.

In FIG. 2 is illustrated an embodiment of an AGC block 30 according to the invention. The AGC 30 is comprising a signal mixer 18, a detection unit 34 connected to a signal sensing device 32, an error signal generating unit 38, a LO signal modifier 42 and a Local oscillator signal generating unit 20. The AGC 30 is also comprising a filter 22 connected to the signal path after the signal mixer 18.

The AGC 30 receives an input signal s(t) having an actual signal level P that has to be adjusted, i.e. attenuated, to a requested target signal level $P_{TG}$. At a predetermined location on the signal path 17, downstream from the signal mixer 18, the AGC 30 measures the signal level P of the signal s(t). Said measured value is denoted as the actual signal level $P_{IS}$=g(t). A detection unit 34 connected to a signal sensing device 32 is used for measuring said actual signal level $P_{IS}$. Said actual signal level or a value corresponding to said value $P_{IS}$ is fed to the error signal generating unit 38. The unit 38 compares said value to a gain reference value $g_{ref}$, that corresponds to the requested target signal level $P_{TG}$ of the signal and generates an error signal $e_g(t)$, which is indicative of how much $P_{IS}$ deviates from $P_{TG}$.

The modifier 42 also receives the error signal $e_g(t)$ and in dependence of said error signal it selects a suitable alternative oscillator signal $as_{LO}(t)$ for compensating for the difference in signal levels $P_{is}$ and $P_{TG}$.

The LO signal modifier 42 is configured to generate a plurality of different alternative oscillator signals. The LO signal modifier 42 receives from the local oscillator 20 a sinusoidal signal or a pulse shaped signal $LO_{IN}$ via a pulse shaper circuit 44. Said modifier 42 modifies at least one feature of the received local oscillator signal $LO_{IN}$, e.g. the signal's period or pulse width. The received local oscillator signal as well as each of the plurality of alternative oscillator signals will comprise the operating frequency to which the signal mixer is set to operate for the frequency translation.

The following criteria may be used in the generation and selection of the alternative oscillator signals:

1) Each alternative oscillator signal is a pulse train, preferably rectangular or square shaped;

2) The pulse width and pulse period of a pulse train are such that the pulse train will comprise a harmonic with a frequency which is equal with the operation frequency of the mixer. Said harmonic has a (non-zero) signal level, e.g. amplitude or power, which is used in the signal mixer as factor when multiplied the signal level of the input signal, e.g. an RF signal. This multiplication results in a down conversion and an attenuation of the input signal.

The generated and selected alternative oscillator signal is fed to the signal mixer 18, which will perform the frequency translation of the input signal s(t). The signal mixer 18 is comparable with a multiplication unit. The multiplication of the input signal and the alternative oscillator signal will result in an output signal s*(t) that is the product of the fundamental signal and all the harmonics constituting the alternative oscillator signal and the input signal. The LO signal modifier 42 is controlled to generate at least one alternative oscillator signal $as_{lo}(t)$ comprising a harmonic signal that when mixed with the input signal to the signal mixer results in an output signal $s(t)=s_{corr}(t)$ having the correct target signal level and frequency and will pass the filter 22, preferably a band-pass filter, which will cancel all other output signals from the mixer stage.

Figure 3:
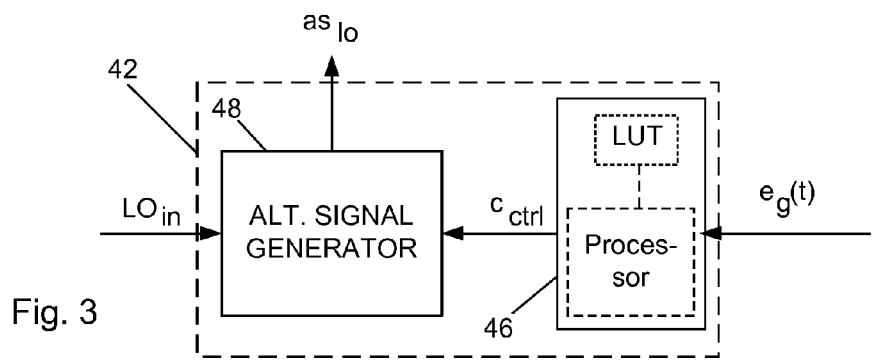
FIG. 3 is a block diagram illustrating an embodiment of a Local Oscillator signal modifier of an AGC block according to the invention.

In FIG. 3 is an embodiment of a LO signal modifier 42 of an AGC block illustrated. The LO signal modifier 42 comprises an Alternative Signal Generator, ASG, block 48 and an ASG controller 46. The ASG controller is configured to receive the error signal $e_g(t)$ and in dependence of said error signal generate an ASG control signal $c_{ctrl}(t)$ to the ASG block 48. The ASG block is capable to generate a plurality of different alternative oscillator signals $as_{LO}(t)$ and which of the alternative oscillator signals that is generated by the ASG 48 is depending on the control signal $c_{ctrl}(t)$, which is depending on the error signal level, e.g. amplitude, to the ASG controller 46. The ASG 48 receives from a local oscillator 20 a sinusoidal signal or a pulse shaped signal via a pulse shaper circuit 44. In dependence of the present error signal, the ASG 48 will modify at least one of the received local oscillator signal features, e.g. the signal's period or pulse width. The received local oscillator signal as well as each of the plurality of alternative oscillator signals will comprise the operating frequency to which the signal mixer is set to operate for the frequency translation.

The ASG controller 46 may be implemented as a digital processor unit comprising a Look-Up Table, LUT. In said LUT, the variable error signal $e_g(t)$ may be used as input value. In the LUT, $c_{ctrl}$ signals are listed which corresponds to different error signals. The ASG controller 46 is adapted to for a given error input signal look up the corresponding $c_{ctrl}$ signal in the LUT. The selected control signal $c_{ctrl}$ corresponds to one alternative oscillator signal $as_{lo}$ of the plurality of alternative oscillator signals that is possible to generate by means of the ASG block 48. The selected control signal $c_{ctrl}$ is generated and fed to the ASG block 48 for controlling the generation of the selected alternative oscillator signal $as_{lo}$ to be fed to the signal mixer 18. The ASG 48 may be implemented by means of a suitable hardware or software controlled circuit that is capable of modifying the received $LO_{in}$ signal into a plurality of alternative oscillator signals and select one of in dependence of the received control signal $c_{ctrl}$.

Figure 4:
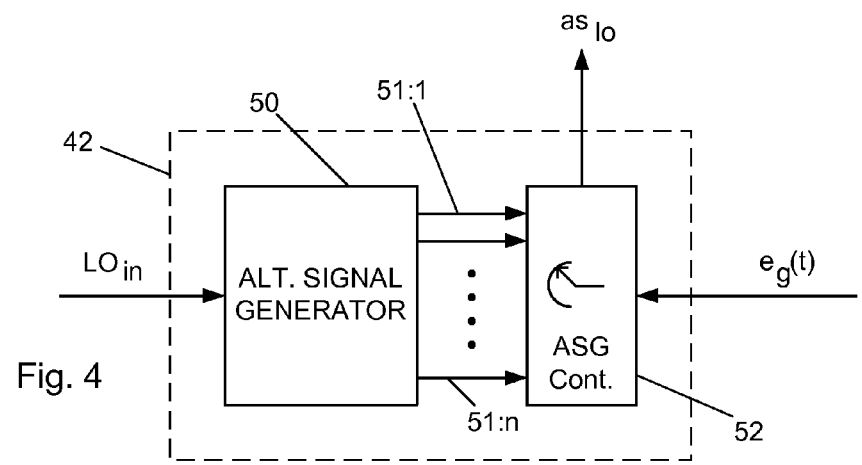
FIG. 4 is a block diagram illustrating an alternative embodiment of a LO signal modifier of an AGC block according to the invention.

In FIG. 4, an alternative embodiment of a LO signal modifier 42 of an AGC block is illustrated. The LO signal modifier 42 comprises an Alternative Signal Generator, ASG, block 50 and an ASG controller 52. The ASG controller 52 is configured to receive the error signal $e_g(t)$ and in dependence of said error signal select at least one oscillator signal of a set of a plurality alternative oscillator signals generated in the ASG block 50. In this embodiment, the ASG controller 52 receives an error signal $e_g(t)$, but said controller 52 will not generate an ASG control signal $c_{ctrl}(t)$ to the ASG block in dependence of said error signal, as in the embodiment described above and illustrated in FIG. 3. In the embodiment according to FIG. 4, a set of alternative oscillator signals is generated and fed on separate connections 51 to the ASG controller 52. The ASG controller 52 is equipped with a selector unit 53 and a number of selectable input ports 51:1, 51:2, 51:3, . . . ; 51:n from which the ASG controller 52 selects by means of the selector block 53 at least one of the input ports on which a suitable alternative oscillator signal is present. Said selected alternative oscillator signal $as_{lo}$ is fed to the signal mixer 18.

The ASG controller 50 may be implemented as a digital processor unit comprising a Look-Up Table, LUT. In said LUT, the variable error signal $e_g(t)$ may be used as input value. In the LUT, said selectable input ports 51:1, 51:2, 51:3, . . . ; 51:n are listed and each input port corresponds to one alternative oscillator signal $as_{lo}$. Hence, in this way one error signal is corresponding to one selectable alternative oscillator signal. The ASG controller 52 is adapted to for a given error input signal look up the corresponding input port 51 in the LUT and control the selector block 53 to select the listed input port that will provide the selected alternative oscillator signal $as_{lo}$ of the plurality of alternative oscillator signals that is generated by means of the ASG block 50. The selected alternative oscillator signal $as_{lo}$ is fed to the signal mixer 18.

The ASG block 50 receives from a local oscillator 20 a sinusoidal signal or a pulse shaped signal via a pulse shaper circuit 44. If a sinusoidal signal is received, the ASG block 50 have to include said pulse shaper circuit 44.

Figure 5:
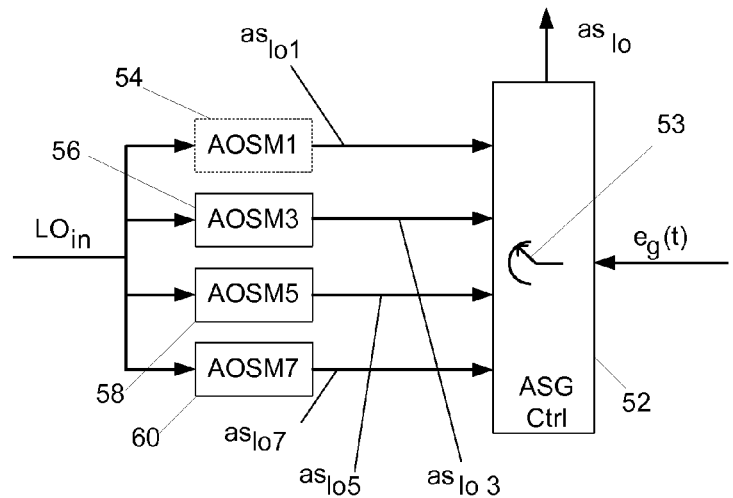
FIG. 5 is a block diagram illustrating an alternative embodiment of a LO signal modifier of an AGC block according to the invention.

In FIG. 5, an embodiment of the ASG block 50 in a LO signal modifier according to the invention is illustrated. The LO signal modifier 42 comprises an Alternative Signal Generator, ASG, block 50 and an ASG controller 52. The ASG controller has already been described in connection with the preceding embodiment in FIG. 4.

The ASG block 50 of this embodiment comprises a number of Alternative Oscillator Signal Modifiers, AOSMs, for generating a set of a plurality of alternative signals. An AOSM may be designed to provide more than one alternative oscillator signal to the ASG controller 50. Each AOSM receives the pulse shaped signal $LO_{IN}$ from a local oscillator unit 20. Known methods and hardware circuit designs may be used for implementing AOSMs that provide the different alternative oscillator pulse trains.

The embodiment of an ASG block 50 illustrated in FIG. 5 comprises four alternative oscillator signal modifiers 54, 56, 58 and 60. The AOSM1 54 is configured to modify the $LO_{IN}$ to an alternative oscillator signal $as_{lo1}$ having the same pulse width and period as the $LO_{IN}$ signal. Thus, the ASG block 50 and the LO signal modifier 42 may provide the LO signal $LO_{IN}$ as received and not modified to be selected to the signal mixer of an automatic gain controller. The AOSM3 56 is configured to modify the $LO_{IN}$ to an alternative oscillator signals $as_{lo\,3}$. The alternative oscillator signal $as_{lo\,3}$ comprises a harmonic signal that has ⅓ of the pulse frequency of the $LO_{IN}$ signal. The AOSM5 58 is configured to modify the $LO_{IN}$ to an alternative oscillator signal $as_{lo5}$ having a harmonic signal that has one fifth of the pulse frequency of the $LO_{IN}$ signal. The AOSM7 60 is configured to modify the $LO_{IN}$ to an alternative oscillator signal $as_{lo7}$ having a harmonic signal that has $1/7^{th}$ of the pulse frequency. These alternative oscillator signals will constitute a set of a plurality of alternative oscillator signals. Each of said alternative oscillator signals is fed to a separate input port 51 of ASG controller 52

It must be pointed out that the AGC block 50 may comprise fewer modifier units or more modifier units than illustrated in FIG. 5. In said figure, the modifier unit AOSM3 56 is configured to provide two alternative oscillator signals, and an embodiment of said AOSM will now be described in more detail with reference to FIG. 6.

Figure 6:
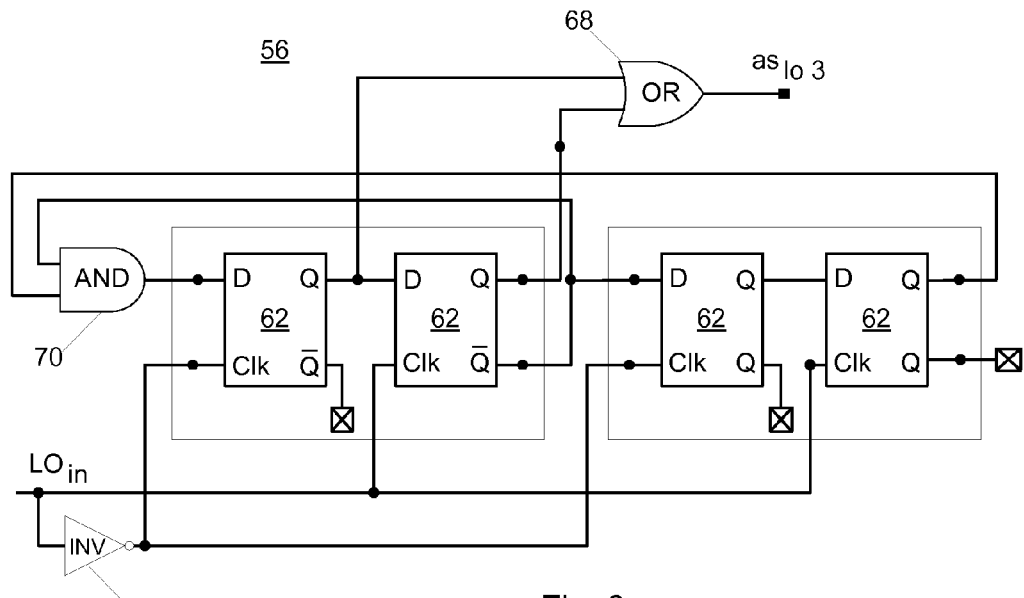
FIG. 6 is a block diagram illustrating a logic circuit solution of an alternative oscillator signal modifier.

In FIG. 6 is a logic circuit solution of the alternative oscillator signal modifier 56 illustrated. It comprises four latches 62 that is connected in such a way that one alternative oscillator signal $as_{lo3}$ will be available on the outputs of the AOSM3. Said alternative oscillator signal is illustrated in FIG. 7b. The modifier unit 56 receives a pulse train signal $LO_{IN}$ having a certain pulse period and pulse width. Two of the latches receive the input pulse train $LO_{IN}$ on their clock inputs CLK and two of the latches receive an inverted signal of the input pulse train $LO_{IN}$ on their clock inputs. Said inverted signal is achieved by an inverter 66 to which the input signal $LO_{IN}$ is connected. Each latch 62 has beside the CLK pulse input a signal input D and two outputs of which one is an inverting output Q⁻ and one non-inverting output Q. By connecting the outputs and inputs of the different latches and by using an AND-gate 70 and an OR-gate 68, it is possible to modify the period and pulse width of the input signal $LO_{IN}$ to achieve at least one requested alternative oscillator signal on an output port of a modifier unit. The embodiment of a modifier illustrated in FIG. 6 is only showing an example that latches, delay elements and different logical circuits may be used for implementing the separate alternative oscillator signal modifiers.

In the drawings FIGS. 7a, 7b, 7c and 7d are illustrated examples of LO signals and from said LO signals generated alternative oscillator signals having different periods and pulse widths compared with the original LO signal.

Figure 7A:
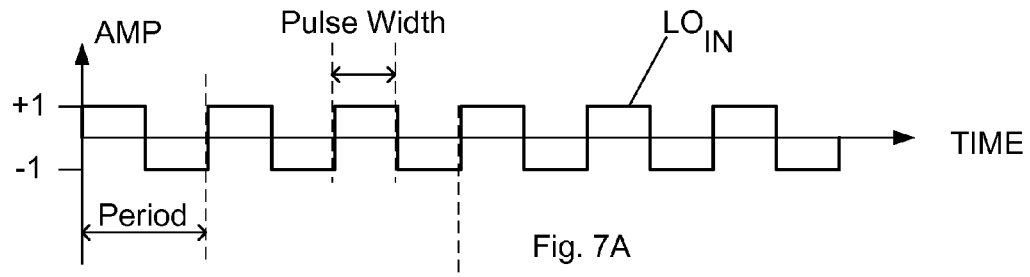
FIGS. 7a, 7b, 7c and 7d are time-to-amplitude signal graphs illustrating examples of alternative oscillator signals having different periods and pulse widths compared with the original LO signal from which they are modified.
Figure 7B:
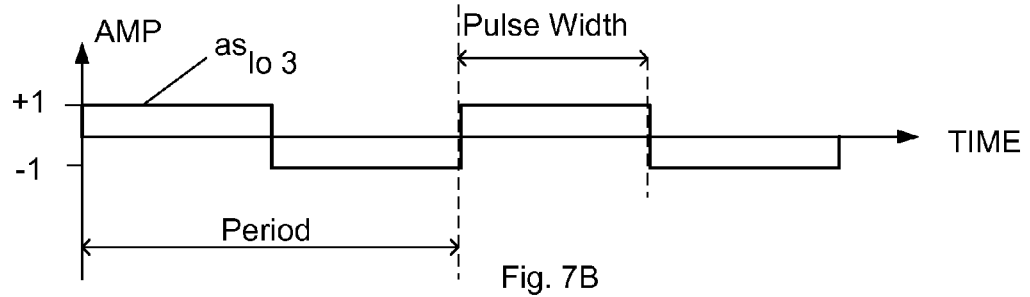

In FIG. 7a is a square shaped pulse train LO signal $LO_{IN}$ illustrated. The pulse train is configured of the fundamental angular frequency $\omega_{LO}$ and its odd numbered harmonics $3\omega_{LO}$, $5\omega_{LO}$, $7\omega_{LO}$, ..., wherein the angular frequency $\omega_{LO}=2\pi\cdot f_{LO}$. If said signal $LO_{IN}$ is fed into the AOSM3 56 illustrated in FIGS. 5 and 6, respectively, an alternative oscillator signal $as_{lo\,3}$ is generated.

In FIG. 7b, said alternative oscillator signal $as_{lo\,3}$ is illustrated. It is a rectangular pulse train having a pulse width that is three times the pulse width of the $LO_{IN}$ signal and three times the pulse period of the $LO_{IN}$ signal.

Figure 7C:
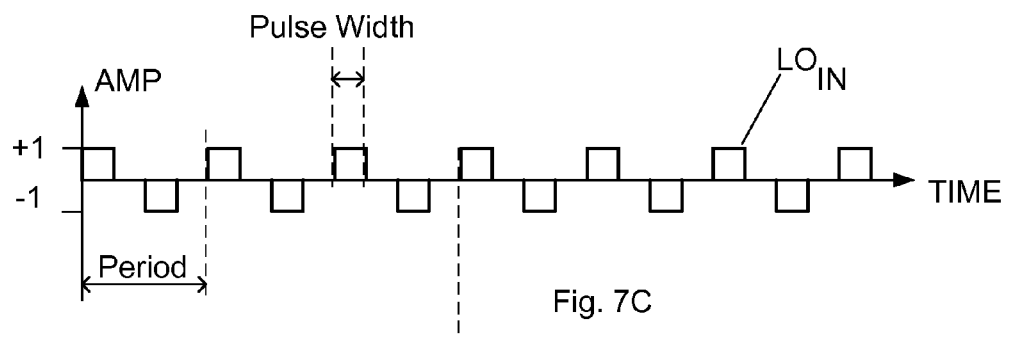
Figure 7D:
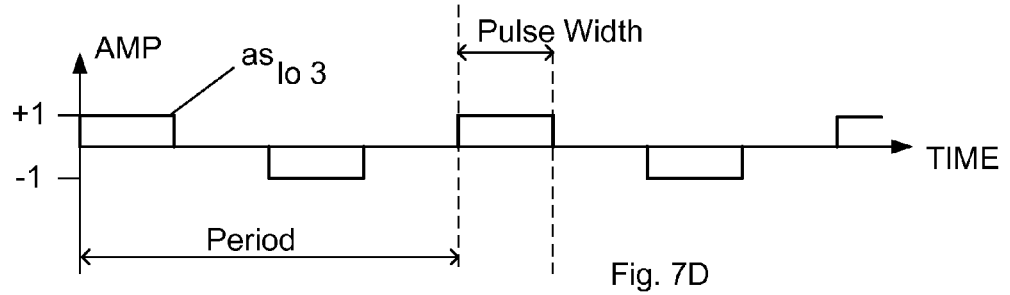

In FIGS. 7c and 7d are another kind of pulse trains to be used as $LO_{IN}$ signals. This kind of pulse trains are called quarter phase pulse trains. The pulse width in said pulse train is a quarter of the period. The $LO_{IN}$ signal comprises three levels +1, 0 and −1. It can be implemented by one pulse train of positive pulses and one pulse train of negative pulses which is phase shifted. Between the quarter pulses, an intermediate level of nil exists. During the positive and negative pulses the mixer will generate an output signal that is the input signal multiplied with +1 or −1, respectively. During the nil time the mixer output will be 0. If said signal $LO_{IN}$ signal of FIG. 7c is fed into a circuit AOSM3 56 provided with two outputs, one for the negative pulse train and one for the positive pulse train, respectively, an alternative oscillator signal $as_{lo\,3}$ is generated according to FIG. 7d. In FIG. 7d, said alternative oscillator signal $as_{lo\,3}$ is a rectangular pulse train having a pulse width that is three times the pulse width of the $LO_{IN}$ signal and three times the pulse period of the $LO_{IN}$ signal. The kind of pulse trains illustrated in FIGS. 7c and 7d is especially useful in receivers when splitting the received signal in one in-phase and one quadrature phase paths.

Theoretical Explanation

A signal mixer has a specific conversion gain that depends on the Local Oscillator signal period and pulse width. The invention changes the LO signal period and pulse width into different alternative oscillation signals to the mixer to realize different conversion gains of the mixer.

An LO signal is a repetitive signal that can be described by a Fourier series. All the harmonics in the Fourier series have different amplitudes. By using different harmonics for different gain settings a programmable gain amplifier or attenuator is implemented.

A signal mixer is implementing a mathematical multiplication of two signals in the time domain. In a radio receiver those two signals are the received signal and the LO signal. Typical the LO signal is a square wave with amplitude +/−1. That signal can with Fourier series theory be described with the following sum.

$$v_{+/-1}(t) = \frac{4}{\pi} \cdot \sum_{n=1,3,5,\ldots}^{\infty} \frac{1}{n}\cos(n\omega_0 t)$$

The signal mixer will multiply the received signal with all of the LO harmonics with respective amplitude. If the fundamental harmonic is used the multiplication is done by $4/\pi$. If the third harmonic is used the multiplication is done by $4/(3\pi)$ and so on.

The received signal can mathematical be described by $$r(t)=a(t)\cdot\cos(\omega_{rf}t+\omega(t))$$

Where a(t) and ω(t) is the amplitude and phase modulation of the signal. This description is called polar description.

Multiplying the received signal with the fundamental harmonic of a square wave LO signal gives the following down converter IF, intermediate frequency, signal. The product-to-sum identity for cosine has been used.

$$v_{lo}^{(1)}(t) = \frac{4}{\pi} \cdot \cos(\omega_{lo}t)$$

$$v_{if}(t) = r(t) \cdot v_{lo}^{(1)}(t)$$

$$v_{if}(t) = \frac{2}{\pi}a(t)[\cos((\omega_{rf}-\omega_{lo})\cdot t + \varphi(t)) + \cos((\omega_{rf}+\omega_{lo})\cdot t + \varphi(t))]$$

From the equations it can be seen that the received signal has been frequency translated to two sidebands with a scale factor of $2/\pi$. The modulation has been kept. If the upper sideband is removed by a filter the down converted signal exists.

The invention uses the fact that different alternative oscillator signal shapes, i.e. pulse width and period, comprise different harmonics and gives different conversion gain. Changing the harmonic and/or the shape of the LO signal a PGA is implemented without any switching element in the signal chain of a receiver.

If the changing of gain is done by using a different harmonic the frequency of the LO is reduced. For example the LO frequency could be $\frac{1}{3}$ of the original one. Then the third harmonic of this lower frequency will down-convert the wanted frequency band. That down-conversion will be done at $\frac{1}{3}$ amplitude and a lower gain of $\frac{1}{3}$ is achieved. $\frac{1}{3}$ is equivalent with $20*\lg(\frac{1}{3})=-9.5$ dB.

There is no limitation of which harmonic to use. Higher harmonics will have lower Fourier coefficients that will give more gain reductions. For a square wave the following gain reductions can be achieved.

| Possible gain reductions for a square wave LO | |
|---|---|
| Harmonic | Gain reduction (dB) |
| 1 | 0 |
| 3 | 9.5 |
| 5 | 14.0 |
| 7 | 16.9 |
| 9 | 19.1 |
| 11 | 20.8 |
| ... | ... |

There is no limitation to only using a square wave alternative oscillator signals. Also other signal shapes can be used as long as they have harmonics of higher orders than the fundamental one.

There is no limitation that the same LO signal shape is used for all harmonics. For example, a ½ period can be used for the fundamental LO and ¼ period for the third harmonic. This will give a different gain reduction compared to only using a ½ period.

Figure 8:
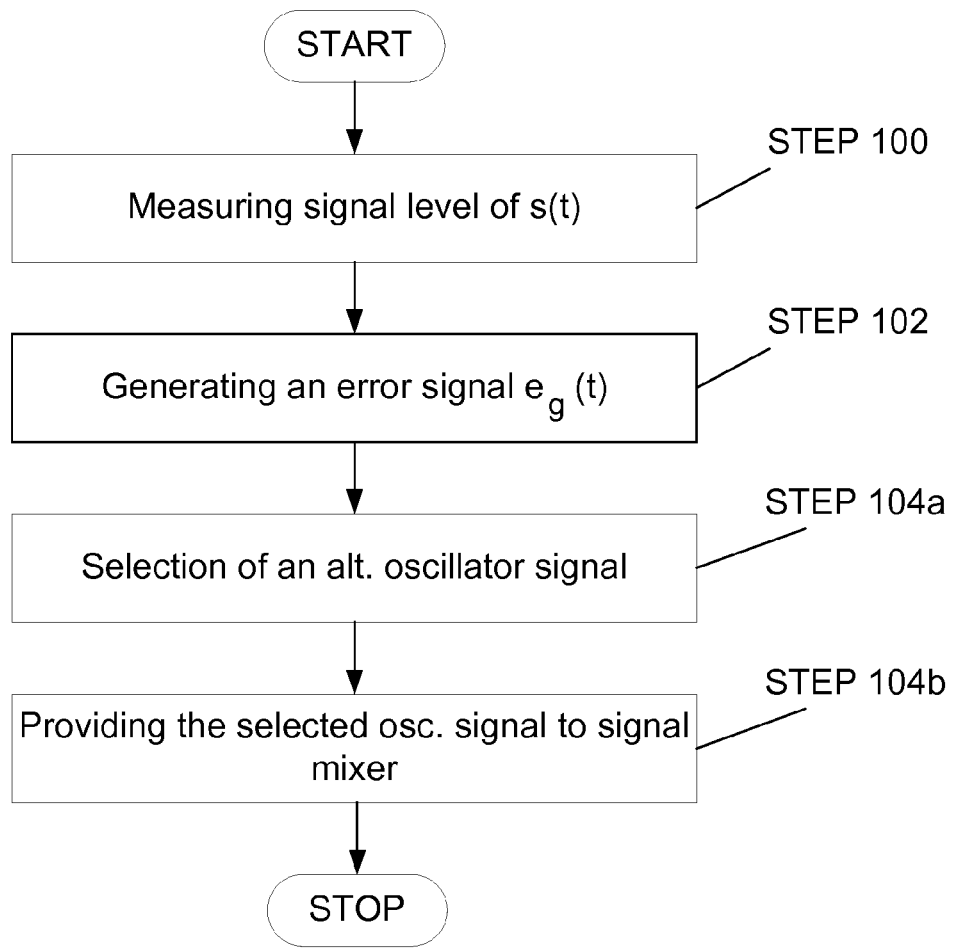
FIG. 8 is a flow chart illustrating an embodiment of a method according to the invention.

An embodiment of the method will now be presented with reference to a flowchart in FIG. 8. In a first step, step 100, of the embodiment the signal level g(t) of the signal s(t) is measured by a measuring means. In the following step 102 and by means of the measured signal level g(t) and a target signal level $g_{ref}$, an error signal $e_g(t)$ is generated as, e.g. the difference between said two signals. The error signal is used, in step 104, to control and adjust said signal level to the target signal level. Said step 104 may be considered to comprise a number of sub-steps, such as selecting based on said error signal one of a plurality of alternative oscillator signals, step 104a, and then, providing the selected oscillator signal to a signal mixer located in the receiver chain upstream of said predetermined location for frequency translation of an input signal to said signal mixer (step 104b).

The method involves repeating the measuring, generating and controlling steps.

The Automatic Gain Control operating according to the above described method comprises a mixer 18, which may have a specific conversion gain that depends on the Local Oscillator signal shape. The AGC 30 may change the LO signal shape to the mixer to realize different conversion gains of the mixer. A plurality of alternative oscillator signals are possible to generate in a LO signal modifier 42 which selects, based on a generated error signal as described above, one alternative oscillator signal as input signal to the local oscillator signal input of the signal mixer 18. Thus, the generated alternative oscillator signal is fed to the signal mixer 18, which will perform the frequency translation of the input signal. The multiplication of the input signal and the alternative oscillator signal will result in an output signal that is the product of the fundamental signal and all the harmonics constituting the alternative oscillator signal and the input signal. The LO signal modifier 42 is controlled to generate at least one alternative oscillator signal comprising a harmonic signal that when mixed with the input signal to the signal mixer 18 results in an output signal having the correct target signal level and frequency.

In one embodiment of the invented method, a plurality of modified oscillator signal $as_{io}(t)$ are generated by modifying a fundamental local oscillator signal $LO_{IN}(t)$ having a first period and a first pulse width.

The local oscillator signal $LO_{IN}$ comprises the operating frequency for the mixer to frequency translate the signal to correct frequency band. In another embodiment of the invention, a set of a plurality of alternative oscillator signals are simultaneously generated by modifying a fundamental local oscillator signal $LO_{IN}(t)$ having a first period and a first pulse width. The selecting step is then performed by selecting one alternative oscillator signal from said set of a plurality of alternative oscillator signals.

In further embodiments, said local oscillator signal is comprised in said plurality of alternative oscillator signals.

In yet further embodiments, said generating step involves at least one of following signal feature modifications: modifying the period of the local oscillator signal or modifying the pulse width of said local oscillator signal.

Figure 9:
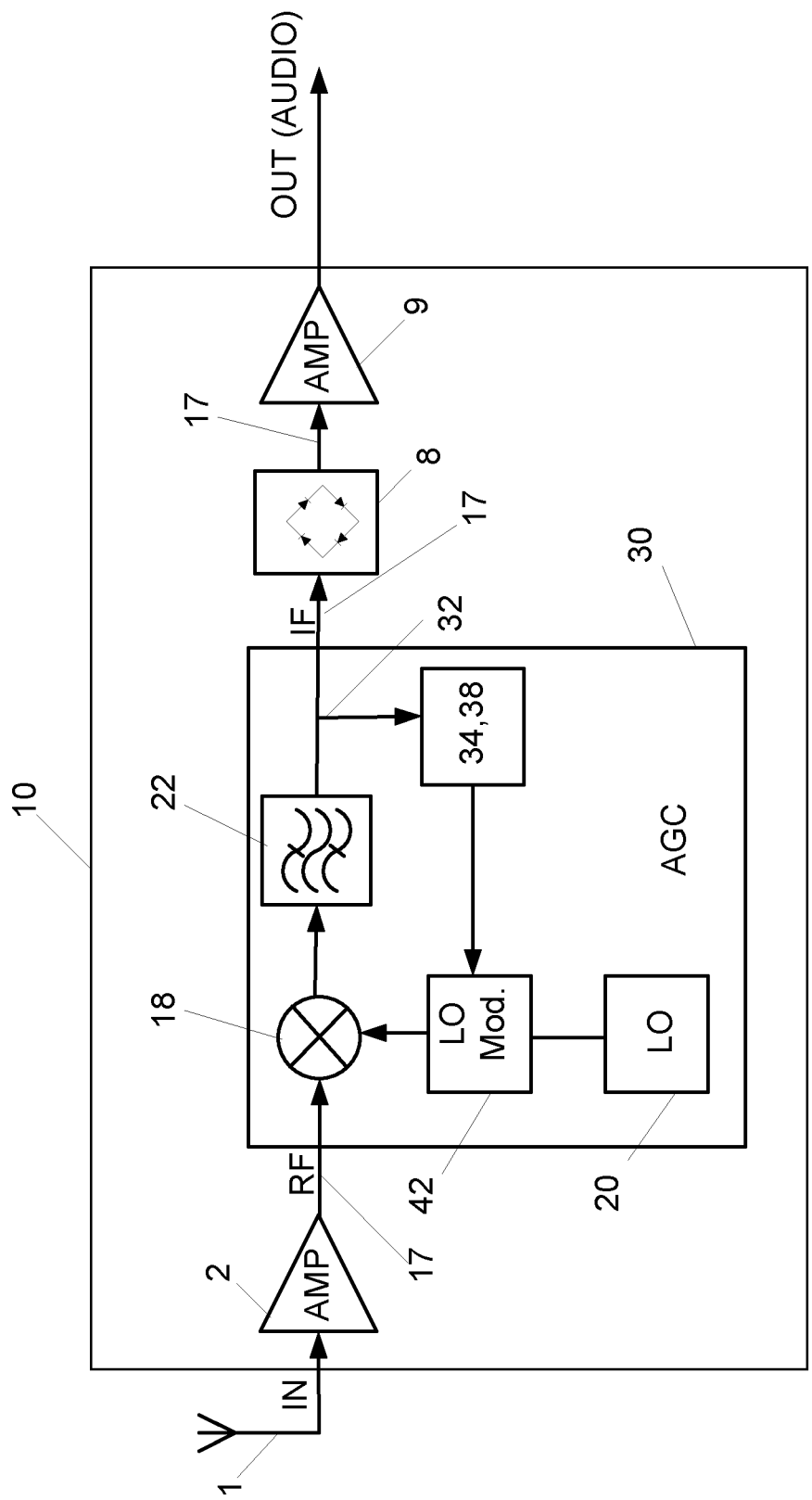
FIG. 9 is a block diagram illustrating a receiver according comprising an automatic gain controller according to invention.

FIG. 9 is illustrating a receiver comprising a receiver chain comprising an automatic gain controller according to the invention.

A signal is received by the antenna 1 which is connected to the input IN of the super heterodyne receiver 10. The information carried by the signal is modulated on a carrier radio wave in the radio frequency RF band. The received signal RF signal is amplified or attenuated by a RF amplifier block 2 such that the amplitude level of the received RF signal is adjusted to the operating level of the receiver 10. The RF signal frequency is adjusted to a lower operating frequency, i.e. a down conversion or frequency shifting/translation is performed from the radio frequency to an Intermediate Frequency, IF. The Intermediate frequency is lower than the radio frequency band but higher than the audio frequency band. The down conversion may also be performed in several steps, or stages, instead of one frequency step. In FIG. 9, only one down conversion step is performed. The down conversion is performed by means of the signal mixer 18 of the Automatic Gain Control block, AGC, 30 which is comprising said signal mixer 18, a signal sensing device 32 connected to detection and error signal generating units 34, 38 (illustrated as one block), a LO signal modifier 42 and a Local oscillator signal generating unit 20. The AGC 30 is also comprising a filter 22 connected to the signal path after the signal mixer 18. Thus, the AGC block 30 according to the invention may be used as a mixer block for frequency shifting. Said block 30 has the advantage over the down conversion block 3 in FIG. 1 in that it does not need an amplifier block 7 for achieving automatic gain control in the signal path 17 in the receiver chain between the antenna 1 and the final amplifier 9. The solution according to the present invention in FIG. 9 eliminates switches in the signal chain 17. The AGC block 30 may be configured according to any of the above described embodiments of the invention, and to operate according any of the embodiments of the invented method.

A number of embodiments of the present invention have been described. It will be understood that various modifications may be made without departing from the scope of the invention. Therefore, other implementations are within the scope of the following claims defining the invention.

The invention claimed is:

1. A method for controlling the signal level of a signal at a predetermined location in a signal path of a receiver chain in a receiver, the method comprising the steps of:
    measuring the signal level of the signal;
    generating an error signal as the difference between the measured signal level and a target signal level; and
    controlling said signal level by controlling a gain of said receiver chain based on said error signal;
    wherein said step of controlling the gain comprises the further steps of:
    generating a modified alternative oscillator signal by modifying a local oscillator signal having a first period and a first pulse width, wherein said modified alternative oscillator signal is comprised in a plurality of alternative oscillator signals;
    selecting, based on said error signal, an alternative oscillator signal from the plurality of alternative oscillator signals; and
    providing the selected alternative oscillator signal to a signal mixer located in the receiver chain upstream of said predetermined location to control frequency translation of an input signal to said signal mixer.

2. The method according to claim 1, wherein said local oscillator signal is comprised in said set of plurality of alternative oscillator signals.

3. The method according to claim 2, wherein said generating a modified alternative oscillator signal step comprises modifying the period of the local oscillator signal or modifying the pulse width of the local oscillator signal.

4. The method according to claim 1, further comprising operating the signal mixer to use the local oscillator signal as an operating frequency to frequency translate the signal to correct frequency band.

5. The method according to claim 1, wherein the method further comprises repeating the measuring, generating the error signal and selecting steps.

6. An automatic gain control block for controlling a signal level of a signal at a predetermined location in a signal path of a receiver chain in a receiver, the automatic gain control block comprising:
    detection and error generating units that are configured to measure the signal level of the signal and to generate an error signal as the difference between the measured signal level and a target signal level; and
    a local signal modifier comprising:
        an alternative signal generator block that is configured to generate a plurality of alternative oscillator signals by modifying a period of a local oscillator signal or modifying a pulse width of the local oscillator signal; and
        an alternative signal generator controller configured to select, based on the error signal, an alternative oscillator signal from the plurality of alternative oscillator signals, and configured to provide the selected alternative oscillator signal to a signal mixer located in the signal path of the receiver chain upstream of said predetermined location to control frequency translation of an input signal to said signal mixer.

7. The automatic gain control block according to claim 6, wherein a local oscillator signal is comprised in said plurality of alternative oscillator signals.

8. The automatic gain control block according to claim 7, wherein the local signal modifier provides the local oscillator signal as an operating frequency for the signal mixer to frequency translate the signal to correct frequency band.

9. The automatic gain control block according to claim 6, wherein the alternative signal generator block comprises at least one Alternative Oscillator Signal Modifier (AOSM) that generates at least one of the plurality of alternative oscillator signals.

10. The automatic gain control block according to claim 6, further comprising:
    a signal level detector adapted for measuring the output signal level of the output signal; and
    a comparator adapted for generating the error signal as the difference between the measured signal level and a predetermined signal level.

* * * * *